(12) United States Patent
Furusato et al.

(10) Patent No.: US 7,388,456 B2
(45) Date of Patent: Jun. 17, 2008

(54) SURFACE ACOUSTIC WAVE FILTER (75) Inventors: Hiroyuki Furusato, Yokohama (JP);
Osamu Kawachi, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 153 days.

(21) Appl. No.: 11/014,164

(22) Filed: Dec. 17, 2004

(65) Prior Publication Data

US 2005/0151601 A1 Jul. 14, 2005

(30) Foreign Application Priority Data

Dec. 19, 2003 (JP) ............................. 2003-423859

(51) Int. Cl.
*H03H 9/64* (2006.01)
(52) U.S. Cl. ...................... 333/193; 333/195
(58) Field of Classification Search ............... 333/193, 333/195
See application file for complete search history.

(56) References Cited

U.S. PATENT DOCUMENTS

| | | | | |
|---|---|---|---|---|
| 5,592,135 A | * | 1/1997 | Taguchi et al. | 333/193 |
| 5,864,262 A | * | 1/1999 | Ikada | 333/193 |
| 5,949,306 A | * | 9/1999 | Hickernell | 333/195 |
| 6,043,726 A | * | 3/2000 | Solal et al. | 333/195 |
| 6,150,900 A | * | 11/2000 | Kadota et al. | 333/133 |
| 6,208,223 B1 | * | 3/2001 | Shimamura et al. | 333/193 |
| 6,246,148 B1 | * | 6/2001 | Flowers et al. | 310/313 B |
| 6,262,637 B1 | * | 7/2001 | Bradley et al. | 333/133 |
| 6,380,827 B1 | * | 4/2002 | Noguchi | 333/193 |
| RE37,790 E | * | 7/2002 | Satoh et al. | 333/193 |
| 6,445,261 B1 | * | 9/2002 | Yuda et al. | 333/133 |
| 6,518,861 B2 | * | 2/2003 | Taniguchi | 333/193 |
| 7,109,827 B2 | * | 9/2006 | Heuermann et al. | 333/189 |

FOREIGN PATENT DOCUMENTS

| | | | |
|---|---|---|---|
| JP | 6-224682 | | 8/1994 |
| JP | 9-205343 | * | 8/1997 |
| JP | 2001-156588 | * | 6/2001 |
| JP | 2003-332884 | * | 11/2003 |

* cited by examiner

*Primary Examiner*—Barbara Summons
(74) *Attorney, Agent, or Firm*—Arent Fox LLP (57) ABSTRACT

A SAW filter includes multiple SAW resonators. The multiple SAW resonators, which are connected in series, are connected any one of between a signal input terminal and a ground that is the closest thereto and between a signal output terminal and another ground that is the closest thereto. The SAW resonators have substantially equal electrostatic capacitances. It is thus possible to protect the SAW resonators without providing a sacrificial electrode for electrostatic breakdown, and thereby possible to configure the SAW filter having a high reliability against the electrostatic discharge.

2 Claims, 6 Drawing Sheets

SURFACE ACOUSTIC WAVE FILTER

BACKGROUND OF THE INVENTION

1. Field of the Invention

This invention generally relates to a surface acoustic wave (hereinafter simply referred to as SAW) filter having a SAW resonator, and more particularly, to a technique for protecting the SAW filter from electrostatic discharge (referred to as ESD).

2. Description of the Related Art

In recent years, wireless devices such as mobile telephones have been downsized rapidly, highly advanced, and highly improved in quality. A high-frequency circuit of the wireless device employs the filter having the SAW resonator. The filter structure includes a ladder-type filter and a multimode filter. The ladder-type filter is composed of multiple SAW resonators that are connected in a ladder structure. The multi-mode filter includes a double-mode SAW filter (referred to as DMS), for example. The SAW resonator includes a pair of comb-like electrodes that face each other on a piezoelectric substrate. This comb-like electrode is referred to as interdigital transducer (IDT). The comb-like electrode includes a bus bar and multiple electrode fingers that extend from the bus bar in the same direction. Gaps between the adjacent electrode fingers and those between edges of the electrode fingers and the bus bar that face the edges are extremely small. Therefore, in the case where static electricity is applied to an input terminal or an output terminal of the SAW filter, an electrostatic discharge occurs between the above-mentioned terminal and the ground. As a result, the SAW resonator, which is arranged between the terminal and the ground, is destroyed.

Japanese Patent Application Publication No. 6-224682 (hereinafter referred to as Document 1) discloses a structure for protecting the SAW resonator that determines the filter characteristics, by providing a sacrificial electrode for electrostatic breakdown. The sacrificial electrode for electrostatic breakdown is connected to the input terminal or the output terminal so as to be broken instead of the SAW resonator, in the case where the static electricity is applied.

However, there is the problem in that once the sacrificial electrode is broken, the SAW filter cannot be protected from the static electricity any longer.

SUMMARY OF THE INVENTION

It is a general object of the present invention to solve the above-mentioned problem and provide the SAW filter with a highly reliable measure against the static electricity.

According to an aspect of the present invention, there is provided a surface acoustic wave (SAW) filter having a plurality of SAW resonators, preferably, the plurality of SAW resonators are connected in series, the plurality of SAW resonators are provided either between a signal input terminal and a ground that is the closest thereto or between a signal output terminal and a ground that is the closest thereto, and the plurality of SAW resonators having substantially equal electrostatic capacitances. It is thus possible to protect the SAW resonators without providing a sacrificial electrode for electrostatic breakdown, and thereby possible to configure the SAW filter having a high reliability against the electrostatic discharge.

In the above-mentioned SAW filter, the plurality of SAW resonators are provided in parallel arms or series arms of the SAW filter. Also, the plurality of SAW resonators are provided in parallel arms of the SAW filter and in series arms of the SAW filter.

In the above-mentioned SAW filter, the plurality of SAW resonators may include a first group of SAW resonators and a second group of SAW resonators, the first group being provided between the signal input terminal and the ground that is the closest thereto, and the second group being provided between the signal output terminal and the ground that is the closest thereto, the SAW resonators of the first group have substantially equal electrostatic capacitances, and the SAW resonators of the second group have substantially equal electrostatic capacitances.

In the above-mentioned SAW filter, the SAW filter may include a ladder-type filter or a multimode filter. In the case where the multimode filter is included, the multimode filter preferably has a balanced output, and the plurality of SAW resonators that are connected in series are respectively coupled to a terminal for the balanced output of the multimode filter.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
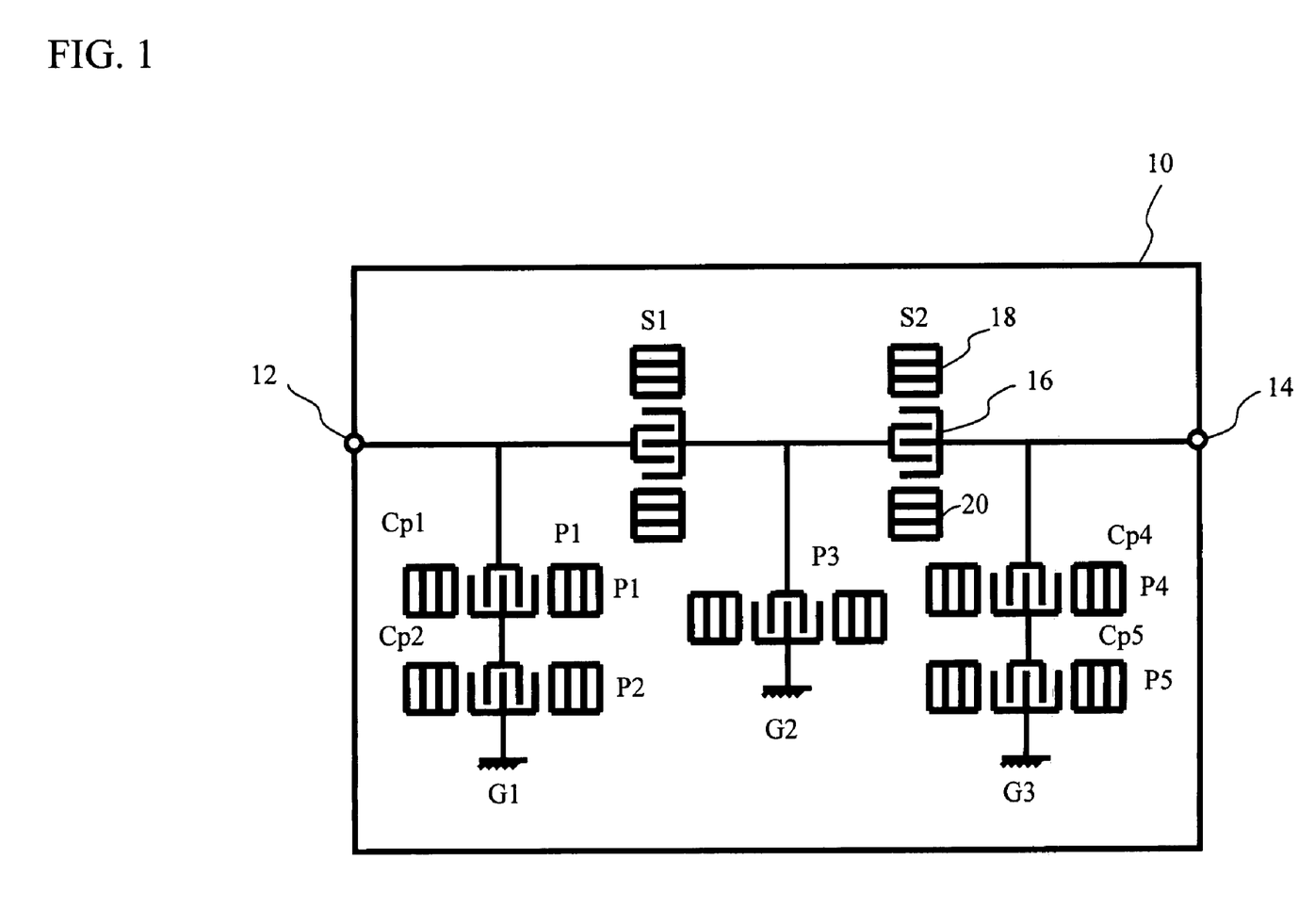
FIG. 1 shows a SAW filter in accordance with a first embodiment of the present invention.

FIG. 1 shows a SAW filter in accordance with a first embodiment of the present invention. The SAW filter includes a piezoelectric substrate 10, multiple SAW resonators S1, S2, P1, P2, P3, P4, and P5 that are provided on the piezoelectric substrate 10, a signal input terminal 12, and a signal output terminal 14. These SAW resonators are connected in the ladder structure. The piezoelectric substrate 10 is made of a piezoelectric single crystal such as lithium tantalite (LT) or lithium niobate (LN). Each of the above-mentioned SAW resonators S1, S2, P1, P2, P3, P4, and P5 includes an IDT electrode 16 and reflection electrodes 18 and 20 that are arranged on both side of a propagation direction. For simplicity of the drawing, the referential numerals 16, 18, and 20 are shown in the SAW resonator S2 only. The IDT electrode 16 includes a pair of comb-like electrodes. Each of the SAW resonators S1 and S2 is disposed in a series arm in the ladder-type structure, and each of the SAW resonators P1 through P5 is disposed in a parallel arm. Therefore, the SAW resonators S1 and S2 are especially referred to as series-arm resonators or series-type resonators, and the SAW resonators P1 through P5 are especially referred to as parallel-arm resonators or parallel-type resonators. Hereinafter S1 and S2 are referred to as series-arm resonators, and P1 through P5 are referred to as parallel-arm resonators. The series-arm resonators S1 and S2 and the parallel-arm resonators P1 through P5 determine the filter characteristics. The SAW filter as shown in FIG. 1 serves as a bandpass filter.

In accordance with the first embodiment of the present invention, the multiple SAW resonators P1 and P2, which are connected in series, are arranged between the input terminal 12 and a ground G1 that is the closest thereto. The multiple SAW resonators P4 and P5, which are connected in series, are arranged between the output terminal 14 and a ground G3 that is the closest thereto. The SAW resonators P1 and P2 have substantially equal electrostatic capacitances Cp1 and Cp2. The SAW resonators P4 and P5 have substantially equal electrostatic capacitances Cp4 and Cp5. More specifically, the multiple SAW resonators P1 and P2, which are connected in series, are connected to the series arm between the signal input terminal 12 and the ground G1 that is the closest thereto, and the multiple SAW resonators P4 and P5, which are connected in series, are connected to the series arm between the signal output terminal 14 and the ground G3 that is the closest thereto. As a matter of convenience, a first group of the SAW resonators is composed of the multiple resonators P1 and P2, which are provided between the signal input terminal 12 and the ground G1 that is the closest thereto. A second group of the SAW resonators is composed of the multiple resonators P4 and P5, which are provided between the signal output terminal 14 and the ground G3 that is the closest thereto. The above-mentioned structure is applied to other embodiments, too. There is no SAW resonator provided in the series arm between the signal input terminal 12 and the ground G1 or in the series arm between the signal output terminal 14 and the ground G3. In addition, the substantially equal denotes that the ratio of the capacitance stays within 0.9 to 1.1. That is, Cp1 divided by Cp2 is equal to 0.9 to 1.1, and Cp4 divided by Cp5 is also equal to 0.9 to 1.1. By setting the electrostatic capacitances as described, in the case where the static electricity is applied to the signal input terminal 12, the voltage applied between the signal input terminal 12 and the ground G1 is divided substantially equally between the parallel-arm resonators P1 and P2. This improves the tolerance for the static electricity. In the same manner, in the case where the static electricity is applied to the signal output terminal 14, the voltage applied between the signal output terminal 14 and the ground G3 is divided substantially equally between the series-arm resonators P4 and P5. In the case where the static electricity is not divided substantially equally as described, an excessive voltage is applied to one of the SAW resonators and there is a possibility of a breakdown.

The electrostatic capacitance of the SAW resonator is defined by multiplying the aperture length of the IDT electrode 16 by the number of pairs of electrode fingers. The aperture length is an overlapped or crossed length in the interleaved or adjacent electrode fingers. As far as the SAW resonators P1 and P2 have substantially equal electrostatic capacitances Cp1 and Cp2, the aperture length or the number of pairs of electrodes fingers may vary. In the same manner, as far as the SAW resonators P4 and P5 have substantially equal electrostatic capacitances Cp4 and Cp5, the aperture length or the number of pairs of electrodes fingers may vary.

Part of the SAW resonator that determines the filter characteristics is configured as described. Thus, it is not necessary to provide the sacrificial electrode for electrostatic breakdown that is not involved in the filter characteristics. This makes it possible to downsize the device. The device is not protected from the electrostatic discharge by destroying the SAW resonator. Thus, this is a highly reliable measure against the static electricity.

The SAW filter as shown in FIG. 1 includes two SAW resonators, which are connected in series, are arranged between the signal input terminal 12 and the ground G1 that is the closest thereto. The SAW filter also includes two SAW resonators, which are connected in series, are arranged between the signal output terminal 14 and the ground G3 that is the closest thereto. Similarly, three or more SAW resonators may be included respectively, and the three or more SAW resonators have substantially equal electrostatic capacitances. In addition, multiple SAW resonators that are connected in series may be arranged either between the signal input terminal 12 and the ground G1 that is the closest thereto or between the signal output terminal 14 and the ground G3 that is the closest thereto. For instance, the parallel-arm resonators P1 and P2, which are arranged between the signal input terminal 12 and the ground G1 that is the closest thereto, may be replaced by a single parallel-arm resonator. In this case, the device cannot be protected from the static electricity that is applied to the signal input terminal 12. However, depending on the purpose, there may be a case where the measure against the static electricity is necessary for the output terminal only. In the same manner, the parallel-arm resonators P4 and P5, which are arranged between the signal output terminal 14 and the ground G3 that is the closest thereto, may be replaced by a single parallel-arm resonator. In this case, the device cannot be protected from the static electricity that is applied to the signal output terminal 14. However, depending on the purpose, there may be a case where the measure against the static electricity is necessary for the input terminal only.

Preferably, the piezoelectric substrate 10 shown in FIG. 1 is hermetically sealed.

Second Embodiment

Figure 2:
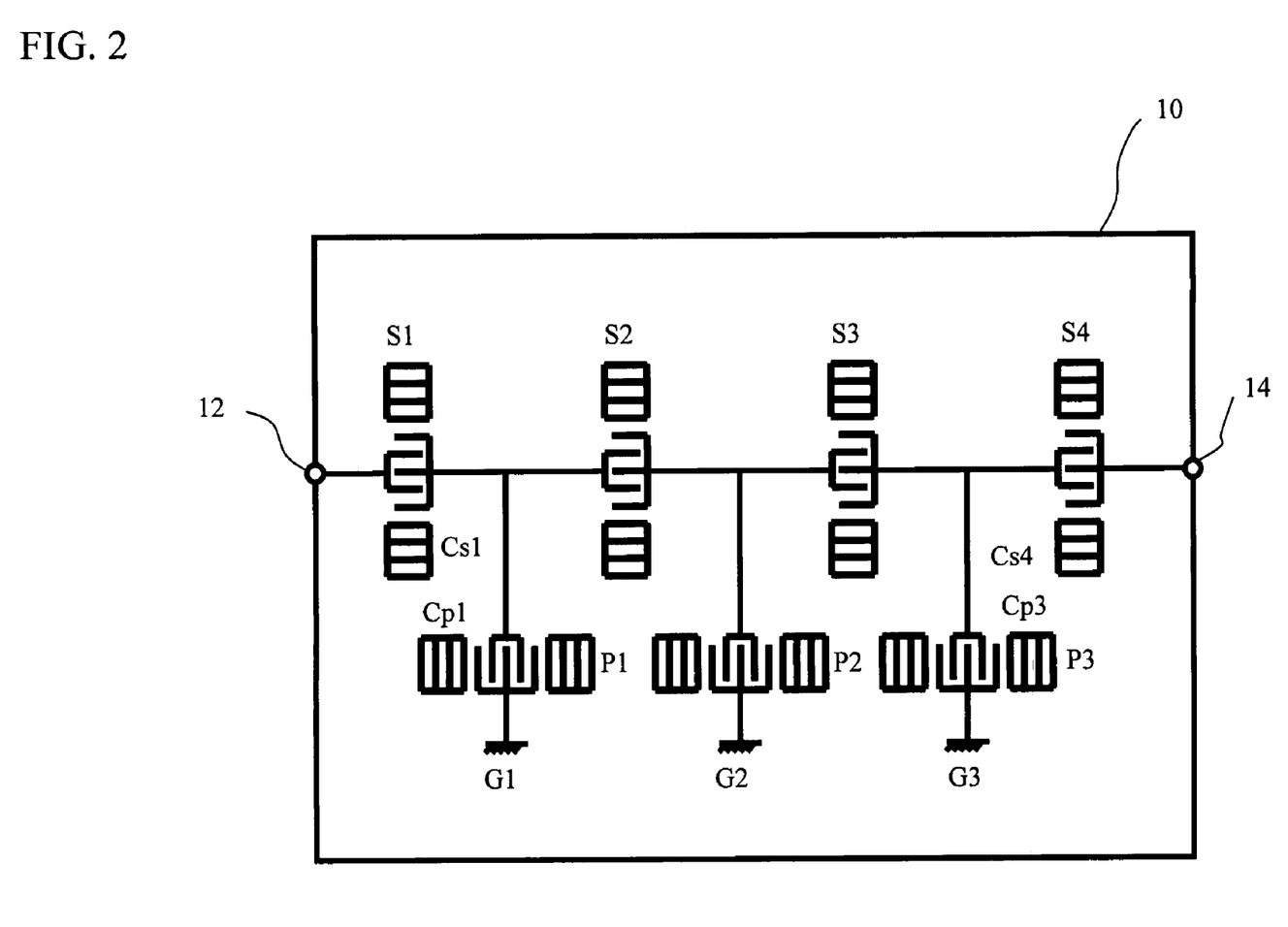
FIG. 2 shows a SAW filter in accordance with a second embodiment of the present invention.

FIG. 2 shows the SAW filter in accordance with a second embodiment of the present invention. The SAW filter includes the piezoelectric substrate 10, multiple SAW resonators S1 through S4 and P1 through P3, the signal input terminal 12, and the signal output terminal 14. These SAW resonators are arranged in the ladder type. The SAW resonators S1 through S4 and P1 through P3 determine the filter characteristics. In accordance with the second embodiment of the present invention, the multiple resonators S1 and P1, which are connected in series, are arranged between the signal input terminal 12 and the ground G1 that is the closest thereto. The multiple resonators S4 and P3, which are connected in series, are arranged between the signal output terminal 14 and the ground G3 that is the closest thereto. The electrostatic capacitance Cs1 of the SAW resonator S1 and the electrostatic capacitance Cp1 of the SAW resonator P1 are substantially equal, and the electrostatic capacitance Cs4 of the SAW resonator S4 and the electrostatic capacitance Cp3 of the SAW resonator P3 are substantially equal. More specifically, the series-arm resonator S1 and the parallel-arm resonator P1, which are connected in series, are arranged between the signal input terminal 12 and the ground G1 that is the closest thereto, and the series-arm resonator S4 and the parallel-arm resonator P3, are arranged between the signal output terminal 14 and the ground G3 that is the closest thereto. The above-mentioned arrangement is different from that of the first embodiment of the present invention. However, the definition of having substantially equal electrostatic capacitance is the same as that of the first embodiment of the present invention. That is, Cs1 divided by Cp1 is equal to 0.9 to 1.1. Cs4 divided by Cp3 is equal to 0.9 to 1.1. By setting the electrostatic capacitances as described, the static electricity applied to the signal input terminal 12 is divided equally between the series-arm resonator S1 and the parallel-arm resonator P1. The static electricity applied to the signal output terminal 14 is divided equally between the series-arm resonator S4 and the parallel-arm resonator P3.

Part of the SAW resonator that determines the filter characteristics is configured as described. Thus, it is not necessary to provide the sacrificial electrode for electrostatic breakdown that is not involved in the filter characteristics. This makes it possible to downsize the device. The device is not protected from the electrostatic discharge by destroying the SAW resonator. Thus, this is a highly reliable measure against the static electricity. In addition, any one of the input side and the output side may satisfy the above-mentioned electrostatic capacitance.

Third Embodiment

Figure 3:
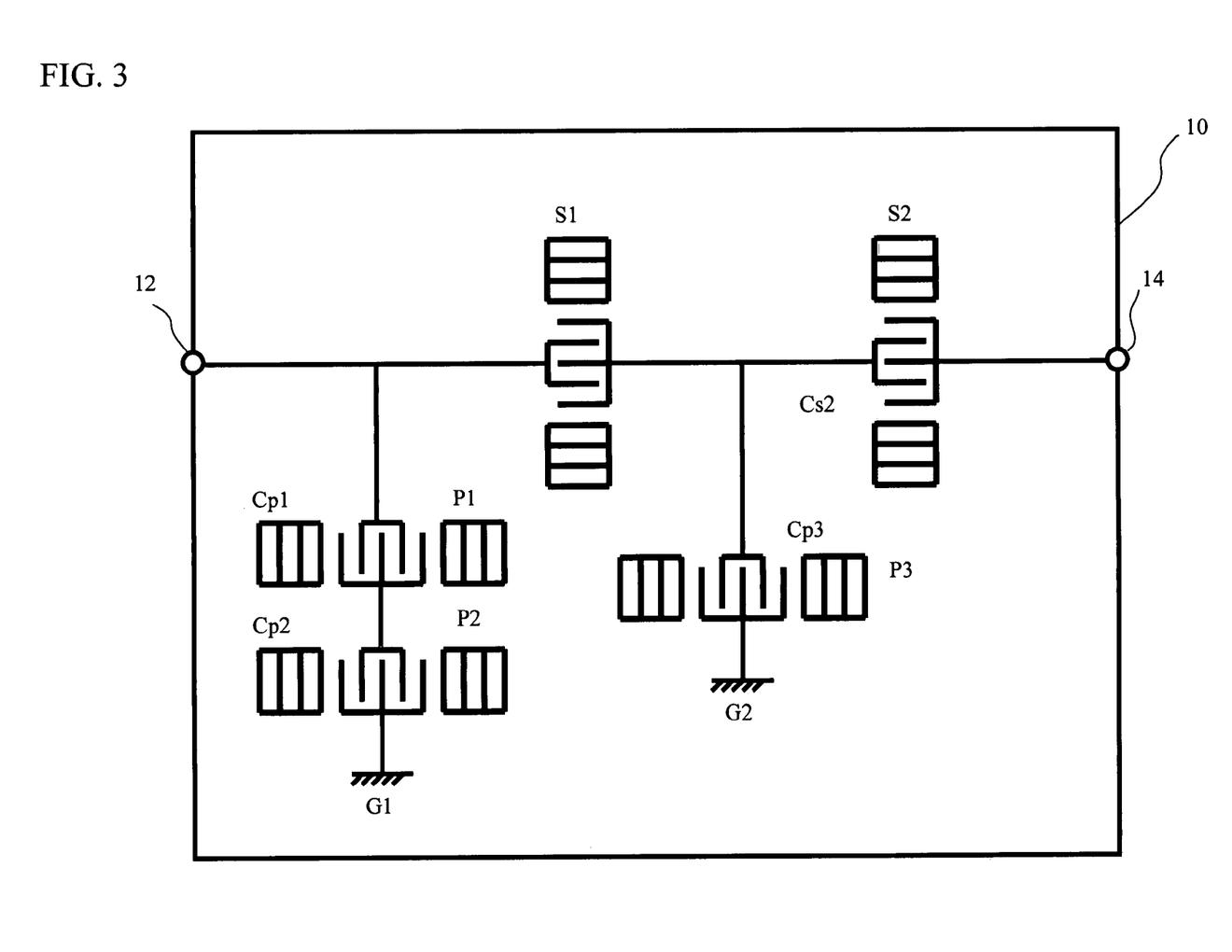
FIG. 3 shows a SAW filter in accordance with a third embodiment of the present invention.

FIG. 3 shows the SAW filter in accordance with a third embodiment of the present invention. This filter is configured to combine the first embodiment and the second embodiment of the present invention. More specifically, the parallel-arm resonators P1 and P2, which are connected in series, are arranged between the signal input terminal 12 and the ground G1 that is the closest thereto. The series-arm resonator S2 and parallel-arm resonator P3, which are connected in series, are arranged between the signal output terminal 14 and the ground G2 that is the closest thereto. The electrostatic capacitance Cp1 of the parallel-arm resonator P1 and the electrostatic capacitance Cp2 of the parallel-arm resonator P2 are substantially equal. Cp1 divided by Cp2 is equal to 0.9 to 1.1. The electrostatic capacitance Cs2 of the series-arm resonator S2 and the electrostatic capacitance Cp3 of the parallel-arm resonator P3 are substantially equal. Cs2 divided by Cp3 is equal to 0.9 to 1.1. Part of the SAW resonator that determines the filter characteristics is configured as described. Thus, it is not necessary to provide the sacrificial electrode for electrostatic breakdown that is not involved in the filter characteristics. This makes it possible to downsize the device. The device is not protected from the electrostatic discharge by destroying the SAW resonator. Thus, this is a highly reliable measure against the static electricity.

Fourth Embodiment

Figure 4:
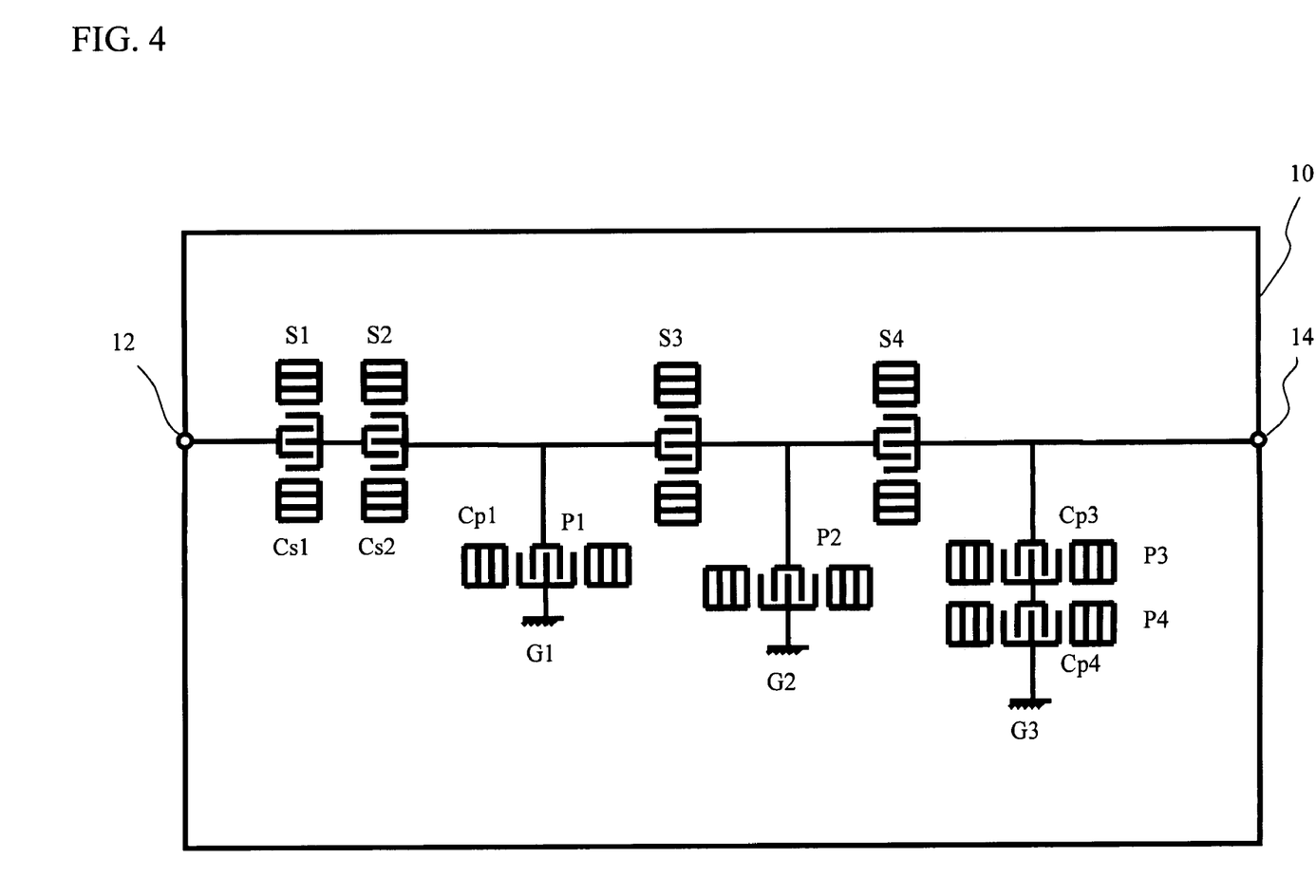
FIG. 4 shows a SAW filter in accordance with a fourth embodiment of the present invention.

FIG. 4 shows the SAW filter in accordance with a fourth embodiment of the present invention. The SAW filter includes the piezoelectric substrate 10, multiple SAW resonators S1 through S4 and P1 through P4, the signal input terminal 12, and the signal output terminal 14. These SAW resonators are arranged in the ladder type. The SAW resonators S1 through S4 and P1 through P4 determine the filter characteristics. In accordance with the fourth embodiment of the present invention, the multiple resonators S1, S2, and P1, which are connected in series, are arranged between the signal input terminal 12 and the ground G1 that is the closest thereto. The electrostatic capacitance Cs1 of the SAW resonator S1, the electrostatic capacitance Cs2 of the SAW resonator S2, and the electrostatic capacitance Cp1 of the SAW resonator P1 are substantially equal. The electrostatic capacitance Cp3 of the SAW resonator P3 and the electrostatic capacitance Cp4 of the SAW resonator P4 are substantially equal. Two series-arm resonators S1 and S2 are arranged in the series arm and a parallel-arm resonator P1 is arranged in the parallel arm on the input side. In the case where the static electricity is applied to the signal input terminal 12, the voltage is divided substantially equally among the three resonators (divided into three). In contrast, in the case where the static electricity is applied to the signal output terminal 14, the voltage is divided substantially equally between the two parallel-arm resonators P3 and P4 (divided into two halves). As described, the divided ratios of the input side and the output side may be different in dividing the voltages. The divided ratios of the input side and the output side may be applied to the first through the third embodiments of the present invention.

Fifth Embodiment

Figure 5:
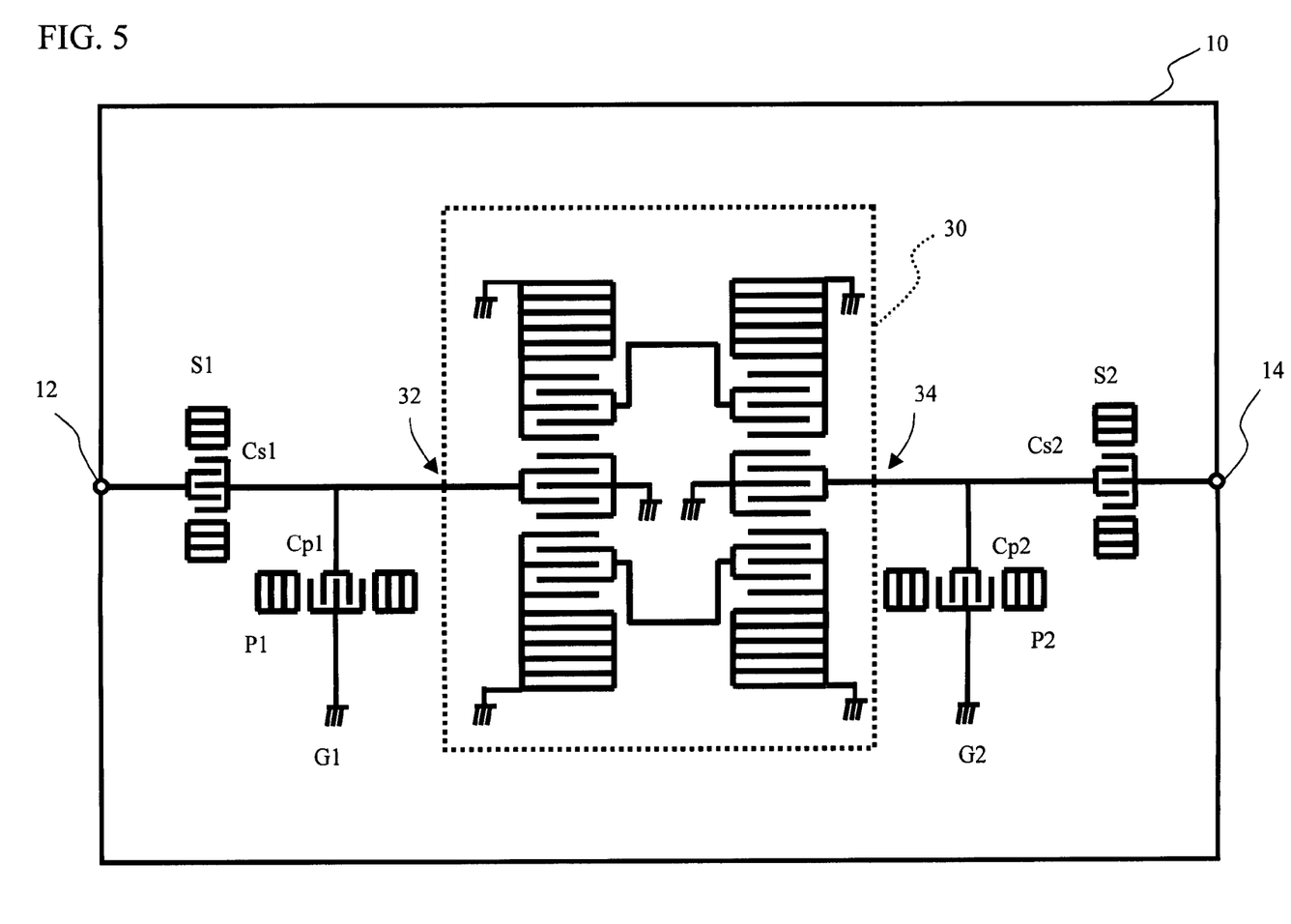
FIG. 5 shows a SAW filter in accordance with a fifth embodiment of the present invention.

FIG. 5 shows the SAW filter in accordance with a fifth embodiment of the present invention. The SAW filter includes the piezoelectric substrate 10, a group 30 of SAW resonators 30, S1, S2, P1, and P2, the signal input terminal 12, and the signal output terminal 14. The group 30 of SAW resonators is used for the double-mode SAW filter. Hereinafter, the filter composed of the group 30 of SAW resonators is referred to as a DMS filter 30, which is one of the multimode filter. The signal input terminal 12 is coupled to an input 32 of the DMS filter 30 via the series-arm resonator S1. An output 34 of the DMS filter 30 is coupled to the signal output terminal 14 via the series-arm resonator S2.

The DMS filter 30, the series-arm resonators S1 and S2, and the parallel-arm resonators P1 and P2 determine the filter characteristics. In accordance with the fifth embodiment of the present invention, the series-arm resonator S1 and the parallel-arm resonator P1, which are connected in series, are arranged between the signal input terminal 12 and the ground G1 that is the closest thereto. The parallel-arm resonator P2 and the series-arm resonator S2, which are connected in series, are arranged between the signal output terminal 14 and the ground G2 that is the closest thereto. The electrostatic capacitance Cs1 of the SAW resonator S1 and the electrostatic capacitance Cp1 of the SAW resonator P1 are substantially equal. Cs1 divided by Cp1 is equal to 0.9 to 1.1. The electrostatic capacitance Cs2 of the SAW resonator S2 and the electrostatic capacitance Cp2 of the SAW resonator P2 are substantially equal. Cs2 divided by Cp2 is equal to 0.9 to 1.1. In the case where the static electricity is applied to the signal input terminal 12, the voltage is divided substantially equally between the series-arm resonator S1 and the parallel-arm resonator P1. In the same manner, in the case where the static electricity is applied to the signal output terminal 14, the voltage is divided substantially equally between the series-arm resonator S2 and the parallel-arm resonator P2.

Part of the SAW resonator that determines the filter characteristics is configured as described. Thus, it is not necessary to provide the sacrificial electrode for electrostatic breakdown that is not involved in the filter characteristics. This makes it possible to downsize the device. The device is not protected from the electrostatic discharge by destroying the SAW resonator. Thus, this is a highly reliable measure against the static electricity. In addition, as necessary, any one of the input side and the output side may include the SAW resonators that are connected in series.

Sixth Embodiment

Figure 6:
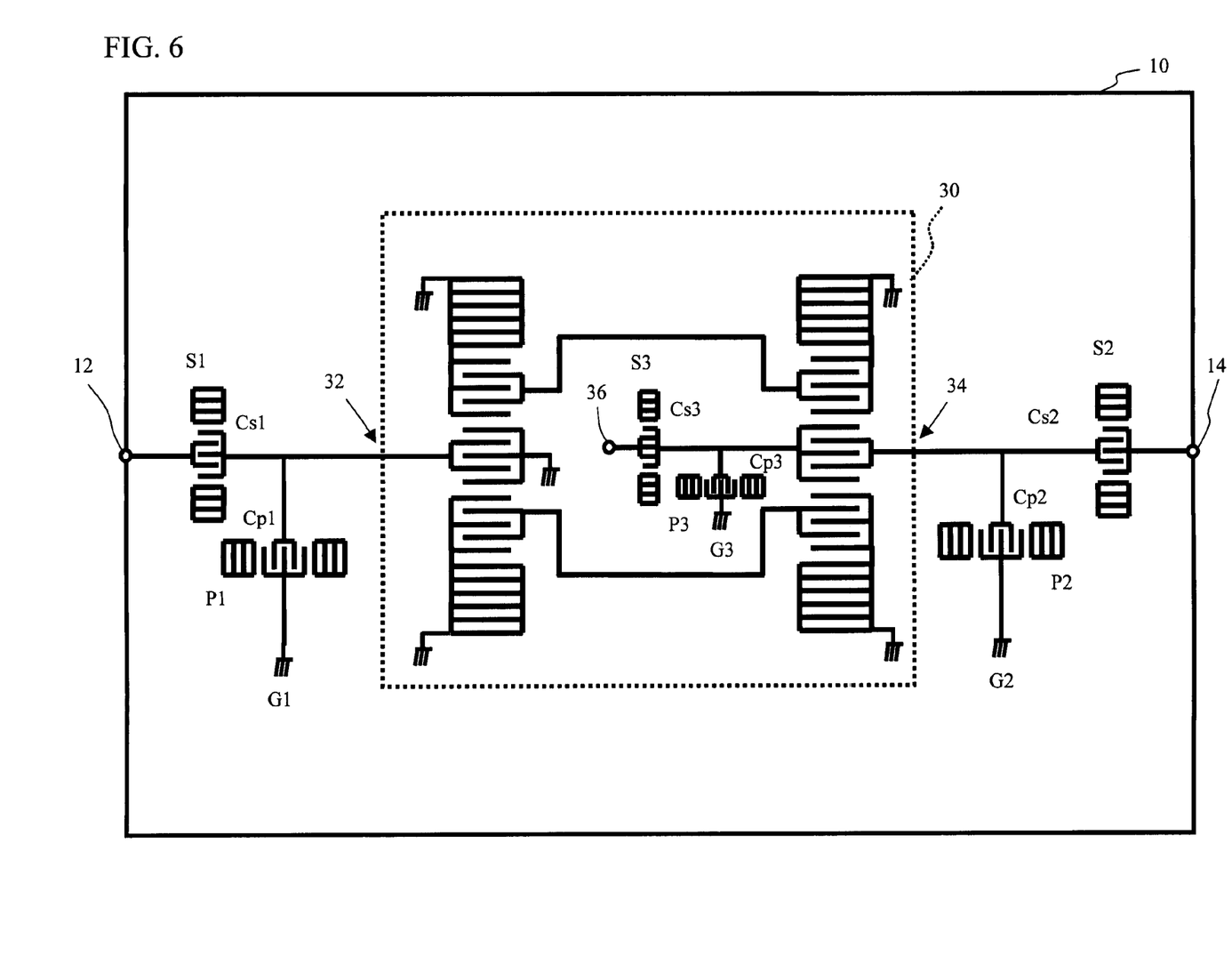
FIG. 6 shows a SAW filter in accordance with a sixth embodiment of the present invention.

FIG. 6 shows the SAW filter in accordance with a sixth embodiment of the present invention. The SAW filter in accordance with the sixth embodiment of the present invention is a variation of the SAW filter in accordance with the fifth embodiment of the present invention as shown in FIG. 5. The DMS filter 30 performs a balanced output. Multiple SAW resonators (two SAW resonators in FIG. 6), which are connected in series, are arranged between terminals 14 and 36 for balanced output and the grounds G2 and G3 that are the closest to the terminals 14 and 36. More specifically, the series-arm resonator S2 and the parallel-arm resonator P2, which are connected in series, are provided between one terminal for balanced output 14 and the ground G2 that is closest thereto. The series-arm resonator S3 and the parallel-arm resonator P3, which are connected in series, are provided between the other terminal for balanced output 36 and the ground G3 that is closest thereto. The electrostatic capacitance $Cs2$ of the SAW resonator S2 and the electrostatic capacitance $Cp2$ of the SAW resonator P2 are substantially equal. $Cs2$ divided by $Cp2$ is equal to 0.9 to 1.1. The electrostatic capacitance $Cs3$ of the SAW resonator S3 and the electrostatic capacitance $Cp3$ of the SAW resonator P3 are substantially equal. $Cs3$ divided by $Cp3$ is equal to 0.9 to 1.1. As a matter of course, the electrostatic capacitance $Cs1$ of the SAW resonator S1 and the electrostatic capacitance $Cp1$ of the SAW resonator P1 are substantially equal. $Cs1$ divided by $Cp1$ is equal to 0.9 to 1.1.

Part of the SAW resonator that determines the filter characteristics is configured as described. Thus, it is not necessary to provide the sacrificial electrode for electrostatic breakdown that is not involved in the filter characteristics. This makes it possible to downsize the device. The device is not protected from the electrostatic discharge by destroying the SAW resonator. Thus, this is a highly reliable measure against the static electricity. In addition, as necessary, any one of the input side and the output side may include the SAW resonators that are connected in series.

The present invention is not limited to the above-mentioned embodiments, and other embodiments, variations and modifications may be made without departing from the scope of the present invention.

The present invention is based on Japanese Patent Application No. 2003-423859 filed on Dec. 19, 2003, the entire disclosure of which is hereby incorporated by reference.

What is claimed is:

1. A surface acoustic wave (SAW) filter comprising:
   a plurality of SAW resonators; and
   a multimode filter, wherein:
   the plurality of SAW resonators are connected to each other in series;
   the plurality of SAW resonators are provided either between a signal input terminal and a ground that is the closest thereto or between a signal output terminal and a ground that is the closest thereto; and
   the plurality of SAW resonators have substantially equal electrostatic capacitances;
   wherein the plurality of SAW resonators are provided in parallel arms of the SAW filter and in series arms of the SAW filter.

2. A surface acoustic wave (SAW) filter having a plurality of SAW resonators and a multimode filter having a balanced output, wherein:
   the plurality of SAW resonators are connected to each other in series;
   the plurality of SAW resonators are provided either between a signal input terminal and a ground that is the closest thereto or between a signal output terminal and a ground that is the closest thereto;
   the plurality of SAW resonators having substantially equal electrostatic capacitances; and
   the plurality of SAW resonators that are connected in series are respectively coupled to a terminal for the balanced output of the multimode filter.

* * * * *